US008981866B2

(12) United States Patent
Frye et al.

(10) Patent No.: US 8,981,866 B2
(45) Date of Patent: *Mar. 17, 2015

(54) SEMICONDUCTOR DEVICE AND METHOD OF FORMING RF BALUN HAVING REDUCED CAPACITIVE COUPLING AND HIGH CMRR

(75) Inventors: Robert C. Frye, Piscataway, NJ (US); Kai Liu, Phoenix, AZ (US)

(73) Assignee: STATS ChipPAC, Ltd., Singapore (SG)

( * ) Notice: Subject to any disclaimer, the term of this patent is extended or adjusted under 35 U.S.C. 154(b) by 144 days.

This patent is subject to a terminal disclaimer.

(21) Appl. No.: 13/571,068

(22) Filed: Aug. 9, 2012

(65) Prior Publication Data
US 2012/0299151 A1  Nov. 29, 2012

Related U.S. Application Data

(63) Continuation of application No. 12/750,555, filed on Mar. 30, 2010, now Pat. No. 8,269,575.

(51) Int. Cl.
*H03H 7/42* (2006.01)
*H01L 23/522* (2006.01)
*H01P 5/10* (2006.01)

(52) U.S. Cl.
CPC ........ *H01L 23/5227* (2013.01); *H01L 23/5223* (2013.01); *H01L 2924/09701* (2013.01); *H01L 2924/3011* (2013.01); *H01L 2224/16225* (2013.01); *H01L 2224/48091* (2013.01); *H01L 2224/48247* (2013.01); *H01L 2224/73265* (2013.01); *H01L 2924/30107* (2013.01)
USPC ................................. 333/25; 333/26; 333/238

(58) Field of Classification Search
CPC ............. H03H 7/42; H03H 7/422; H01P 5/10
USPC .............................................. 333/25, 26, 238
See application file for complete search history.

(56) References Cited

U.S. PATENT DOCUMENTS 7,242,245 B2    7/2007 Burns et al.
7,683,733 B2 *  3/2010 Li et al. ........................... 333/25

(Continued)

FOREIGN PATENT DOCUMENTS

CN          101441934 A      5/2009
WO       2009/099692 A1      8/2009

OTHER PUBLICATIONS

STATS ChipPAC, "DCS Band Balun (SCI-108 W/F", IPD Products Databook, Integrated Passive Devices, 2nd Ed., 7 pages, 2009.

*Primary Examiner* — Dean O Takaoka
(74) *Attorney, Agent, or Firm* — Robert D. Atkins; Atkins and Associates, P.C.

(57) ABSTRACT

A semiconductor device has an RF balun formed over a substrate. The RF balun includes a first conductive trace wound to exhibit inductive properties with a first end coupled to a first terminal of the semiconductor device and second end coupled to a second terminal of the semiconductor device. A first capacitor is coupled between the first and second ends of the first conductive trace. A second conductive trace is wound to exhibit inductive properties with a first end coupled to a third terminal of the semiconductor device and second end coupled to a fourth terminal of the semiconductor device. The first conductive trace is formed completely within the second conductive trace. The first conductive trace and second conductive trace can have an oval, circular, or polygonal shape separated by 50 micrometers. A second capacitor is coupled between the first and second ends of the second conductive trace.

24 Claims, 6 Drawing Sheets

(56) References Cited

U.S. PATENT DOCUMENTS

| | | | |
|---|---|---|---|
| 7,892,858 B2 * | 2/2011 | Liu et al. | 438/3 |
| 8,269,575 B2 * | 9/2012 | Frye et al. | 333/25 |
| 2008/0042792 A1 | 2/2008 | Chiu | |
| 2009/0066457 A1 | 3/2009 | Uchida | |
| 2011/0241163 A1 * | 10/2011 | Liu et al. | 257/531 |

* cited by examiner

SEMICONDUCTOR DEVICE AND METHOD OF FORMING RF BALUN HAVING REDUCED CAPACITIVE COUPLING AND HIGH CMRR

CLAIM TO DOMESTIC PRIORITY

The present application is a continuation of U.S. patent application Ser. No. 12/750,555, now U.S. Pat. No. 8,269,575, filed Mar. 30, 2010, which application is incorporated herein by reference.

FIELD OF THE INVENTION

The present invention relates in general to semiconductor devices and, more particularly, to a semiconductor device and method of forming an RF balun having reduced capacitive coupling between LC resonators and high CMRR.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

An RF balun (balanced and unbalanced) is an important component in wireless communication systems. The RF balun is used to convert differential signals, e.g., from a power amplifier or transceiver, to single-end signal, with proper impedance transformation. The balun suppresses electrical noise, performs impedance transformation and matching, and minimizes common-mode (noise random noise or other electrical interference) through electromagnetic coupling.

Figure 1:
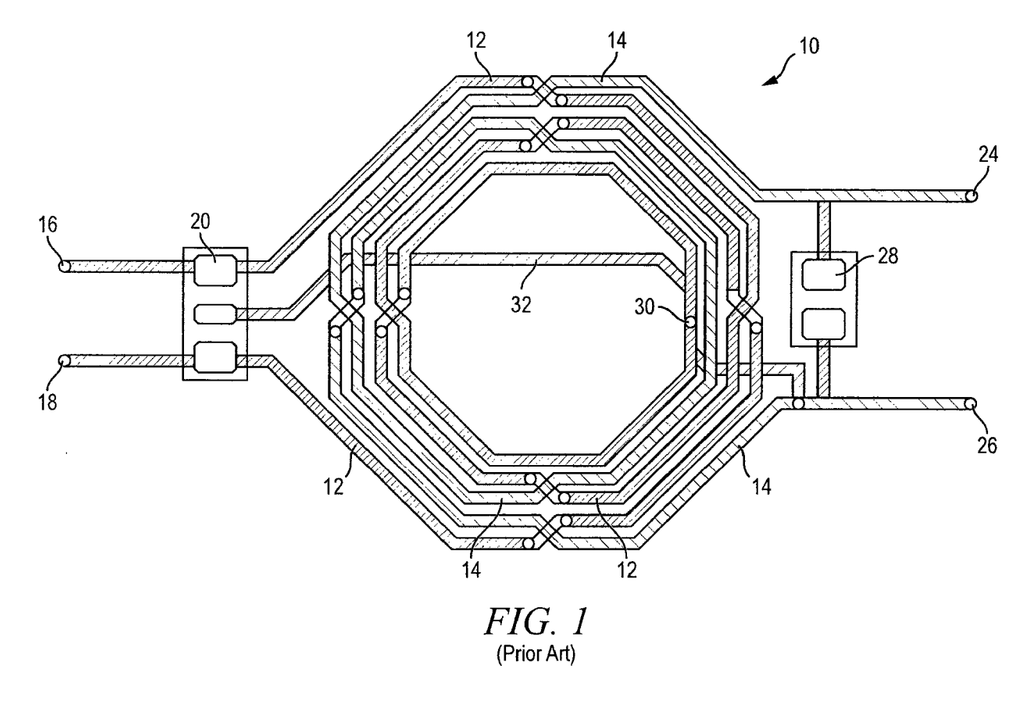
FIG. 1 is a conventional RF balun with first and second inter-wound coils.

A conventional RF balun 10 is shown in FIG. 1 with conductive trace or coil 12 inter-wound or interleaved with conductive trace or coil 14 to increase mutual coupling between the inductors. Conductive trace 12 has first and second end terminals coupled to balanced ports 16 and 18. Capacitor 20 is coupled between ports 16 and 18. The inductor 12 and capacitor 20 constitute a first LC (inductor and capacitor) resonator. Conductive trace 14 has first and second end terminals coupled to unbalanced port 24 and port 26 (ground terminal). Capacitor 28 is coupled between ports 24 and 26. The center-tap 30 and conductive trace 32 supplies a DC bias to balanced ports 16 and 18. The inductor 14 and capacitor 28 constitute a second LC resonator.

A figure of merit for the RF balun performance is common-mode rejection ratio (CMRR). An insufficient CMRR results in power supply modulation and self-mixing in receiver circuits, such as the low noise amplifier. The harmonic response of an electrical device, such as a power amplifier, often exist in common-mode form. To reduce the unwanted harmonic response, a high CMRR is desirable in the RF balun.

A high CMRR can be difficult to achieve with the implementation shown in FIG. 1, particularly at higher frequencies, due in part to capacitive coupling between the LC resonator 12 and 20 and the LC resonator 14 and 28. The currents in LC resonators are coupled by mutual inductance. An input signal to the unbalanced LC resonator induces current in the balanced LC resonator, and vice-versa. Ideally, a common-mode signal applied to the balanced ports 16 and 18 causes equal and opposite currents to flow in inductor 14 and no signal is transferred to the unbalanced port 24. To compensate, the size of the RF balun is made relatively large for strong magnetic coupling. The coupling coefficient between the LC resonators is typically made as large as practical, e.g., larger than 0.6, to achieve the requisite magnetic coupling. In addition, the capacitive coupling between the LC resonators is made large for greater bandwidth.

However, parasitic capacitive coupling between LC resonators allows leakage of the common-mode signal to the unbalanced port, particularly at higher frequencies. While the larger balun with interleaved conductive traces has certain advantages, i.e., robustness to manufacturing variation as well as improved bandwidth, pass-band response, matching, loaded Q, resistive losses, and insertion loss, it also consumes die area which adds cost to the manufacturing process, reduces balance, and increases capacitive coupling which decreases CMRR.

SUMMARY OF THE INVENTION

A need exists for an RF balun with reduced capacitive coupling and high CMRR. Accordingly, in one embodiment, the present invention is a method of making a semiconductor device comprising the steps of providing a substrate, forming an inner conductive trace over the substrate and wound to exhibit an inductive property including a first end coupled to a first terminal of the semiconductor device and a second end coupled to a second terminal of the semiconductor device, and forming an outer conductive trace over the substrate around the inner conductive trace and wound to exhibit an inductive property including a first end coupled to a third terminal of the semiconductor device and a second end coupled to a fourth terminal of the semiconductor device.

In another embodiment, the present invention is a method of making a semiconductor device comprising the steps of providing a substrate, forming a first conductive trace over the substrate and wound to exhibit an inductive property, and forming a second conductive trace over the substrate and wound to exhibit an inductive property with the first conductive trace disposed completely within the second conductive trace.

In another embodiment, the present invention is a method of making a semiconductor device comprising the steps of providing a substrate, forming a first inductor over the substrate, and forming a second inductor over the substrate with the first inductor disposed within the second inductor.

In another embodiment, the present invention is a semiconductor device comprising a substrate and first conductive trace formed over the substrate and wound to exhibit an inductive property. A second conductive trace is formed over the substrate and wound to exhibit an inductive property with the first conductive trace disposed within the second conductive trace.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
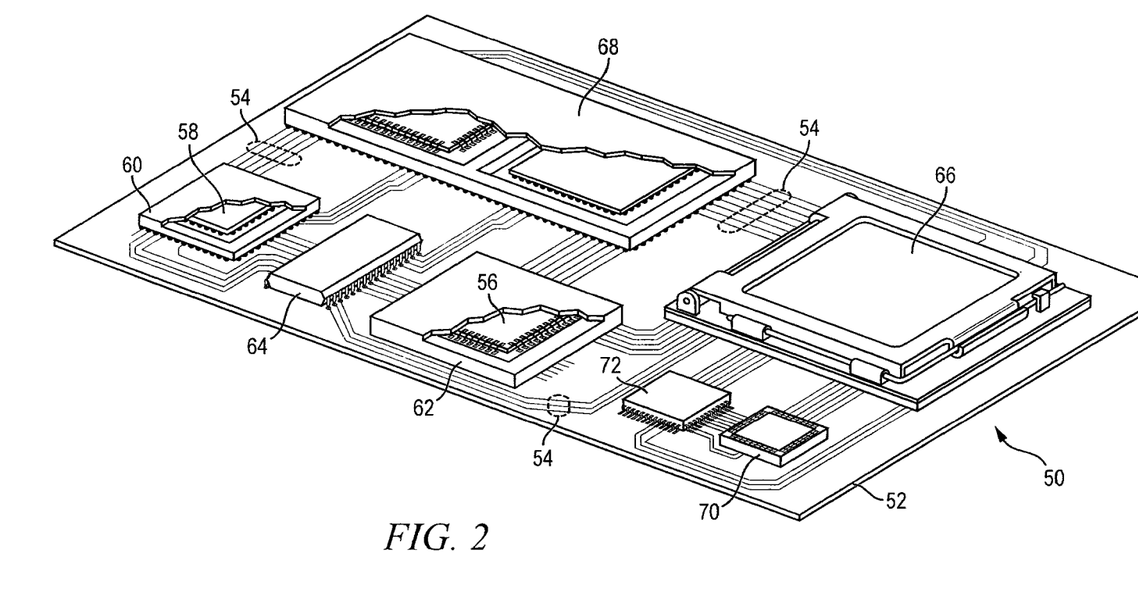
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture, resulting in a lower cost for consumers.

Figure 3A:
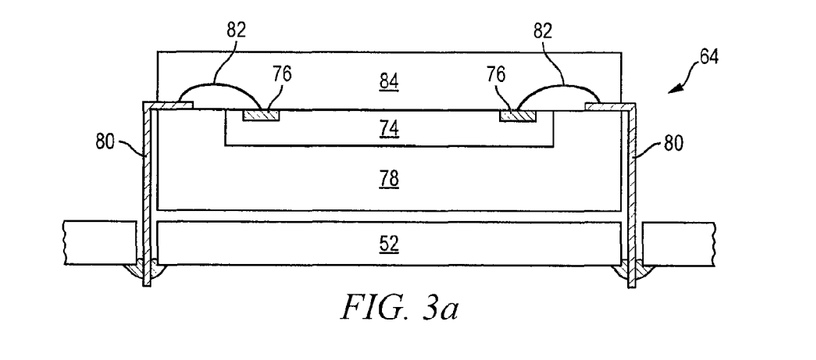
FIGS. 3a-3c illustrate further detail of the representative semiconductor packages mounted to the PCB.
Figure 3B:
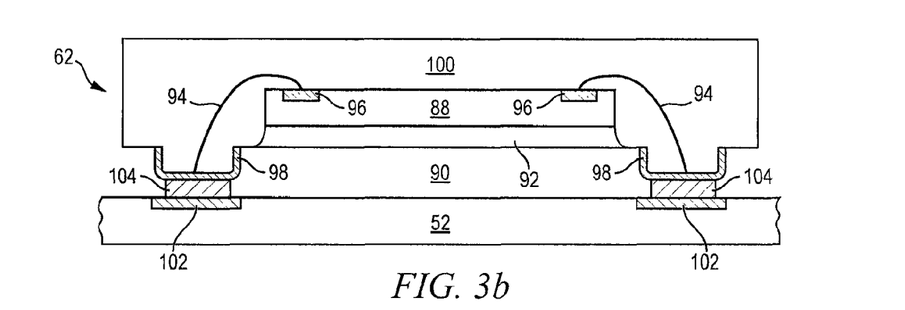
Figure 3C:
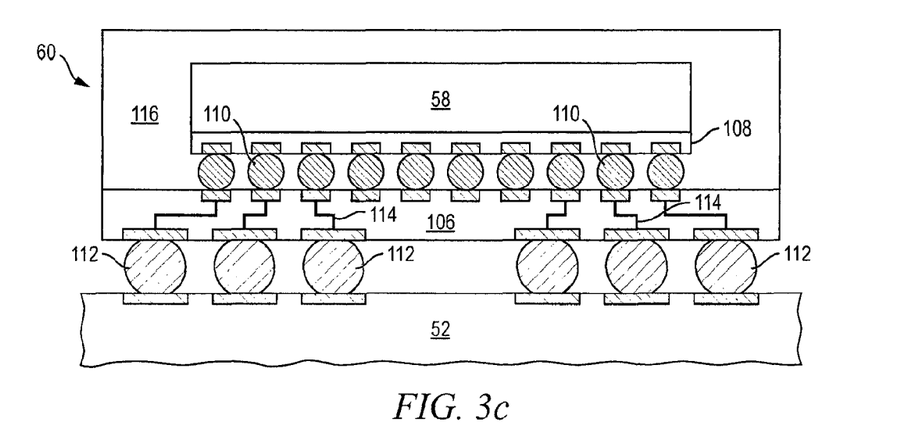

FIGS. 3*a*-3*c* show exemplary semiconductor packages. FIG. 3*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3*c*, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4:
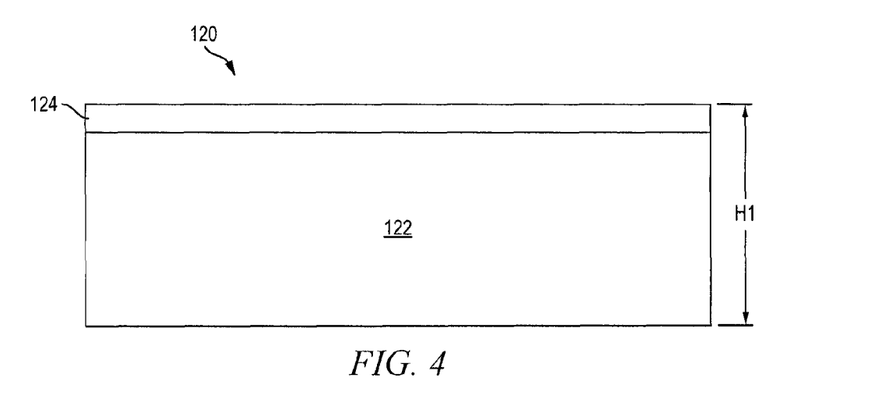
FIG. 4 illustrates a semiconductor die with an integrated passive device formed on the active surface.

In FIG. 4, semiconductor die or package 120 is shown, in relation to FIGS. 2 and 3a-3c, as having a semiconductor substrate 122 made with a base material such as silicon (Si), germanium, gallium arsenide (GaAs), glass, low temperature co-fired ceramic (LTCC), PCB, or other bulk semiconductor material for structural support. An active region 124 is formed over the top surface of semiconductor substrate 122. Active region 124 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface of the die to implement analog circuits or digital circuits. Semiconductor die 122 also contain one or more IPDs, such as thin film inductors, capacitors, and resistors, for RF signal processing. Active region 124 occupies about 5-10% of the overall thickness or height H1 of semiconductor die 120. In one embodiment, semiconductor die 120 occupies an area 0.8 millimeters (mm) by 0.45 mm. Semiconductor die 120 can be electrically connected to other devices using flipchip, bond wires, or interconnect pins.

Semiconductor devices containing a plurality of IPDs can be used in high frequency applications, such as microwave radar, telecommunications, wireless transceivers, electronic switches, and other devices performing RF electrical functions. The IPDs provide the electrical characteristics for circuit functions such as baluns, resonators, high-pass filters, low-pass filters, band-pass filters (BPF), symmetric Hi-Q resonant transformers, matching networks, RF couplers, and tuning capacitors. For example, the IPDs can be used as front-end wireless RF components, which can be positioned between the antenna and transceiver. The balun suppresses electrical noise, provides mode conversion from a single-ended to differential port, performs impedance transformation and matching, and minimizes common-mode noise through electromagnetic coupling. In some applications, multiple baluns are formed over a common substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions. The wireless application can be a cellular phone using multiple band operation, such as wide-band code division multiple access (WCDMA) bands (PCS, IMT, low) and global system mobile communication (GSM) bands (low and high).

Figure 5:
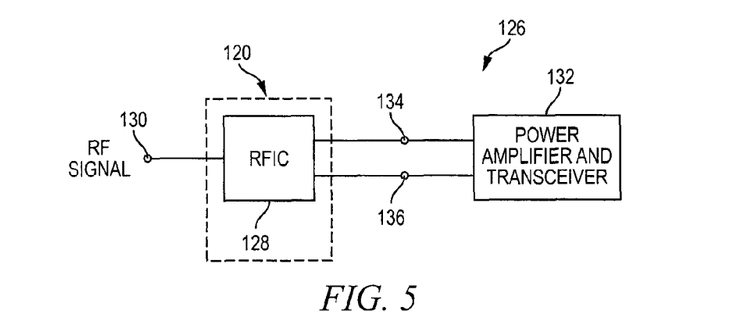
FIG. 5 illustrates a wireless communication system with integrated RF balun connected to power amplifier and transceiver.

FIG. 5 illustrates a wireless communication system 126 using an RF integrated circuit (RFIC) 128. RFIC 128 contains an RF balun as an IPD monolithically integrated on substrate 122 of a single semiconductor die 120. The RF balun can operate in a variety of frequency ranges, e.g., 1.71-1.91 or 5.15-5.83 GHz. RFIC 128 receives RF signal on unbalanced port 130 and provides a balanced differential RF signal to power amplifier (PA) and transceiver 132 on ports 134 and 136. PA and transceiver 132 amplifies the RF signal for transmission and receive RF signals in full-duplex, and filter and condition the signals for further processing.

With growing emphasis on miniaturization in wireless consumer products, there is a trend to integrate RF balun transformers into a common package, either using on-chip passive components or as separate IPDs. The IPDs are especially attractive for integration in RFIC 128 because of the common form factor and low cost. The IPDs also have performance advantages over on-chip passive components.

Figure 6:
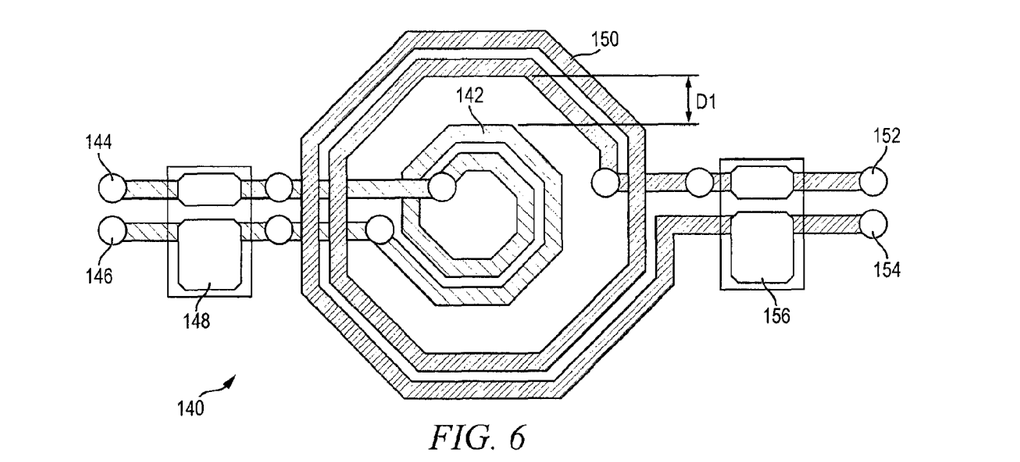
FIG. 6 illustrates further detail of the integrated RF balun.

Further detail of RFIC 128 is shown in FIG. 6 with an integrated RF balun 140 implemented using LC resonators. A conductive trace or coil 142 is wound to exhibit inductive properties and includes first and second end terminals coupled to port 144 and port 146. In one embodiment, port 144 is a single-ended unbalanced port and port 146 is a ground terminal. Alternatively, port 146 is a single-ended unbalanced port and port 144 is the ground terminal. Conductive trace 142 is formed in a polygonal, circular, or oval shape with a line width of 20 micrometers ($\mu$m) and pitch or spacing of 10 $\mu$m. A capacitor 148 is coupled between port 144 and port 146. The inductor 142 and capacitor 148 constitute a first LC resonator.

Another conductive trace or coil 150 is wound to exhibit inductive properties and includes first and second end terminals coupled to balanced ports 152 and 154. Conductive trace 150 is formed around conductive trace 142 such that conductive trace 142 (inner conductive trace) is disposed predominantly or substantially inside conductive trace 150 (outer conductive trace) with separation D1=50 $\mu$m to reduce both inductive coupling and capacitive coupling between the conductive traces. In other words, all parts of the wound portion of conductive trace 142 are disposed completely within all parts of the wound portion of conductive trace 150, as shown in FIG. 6. Conductive trace 150 can be formed with a polygonal, circular, or oval shape and line width of 20 $\mu$m and pitch or spacing of 10 $\mu$m. A capacitor 156 is coupled between balanced ports 152 and 154. The inductor 150 and capacitor 156 constitute a second LC resonator.

Figure 7:
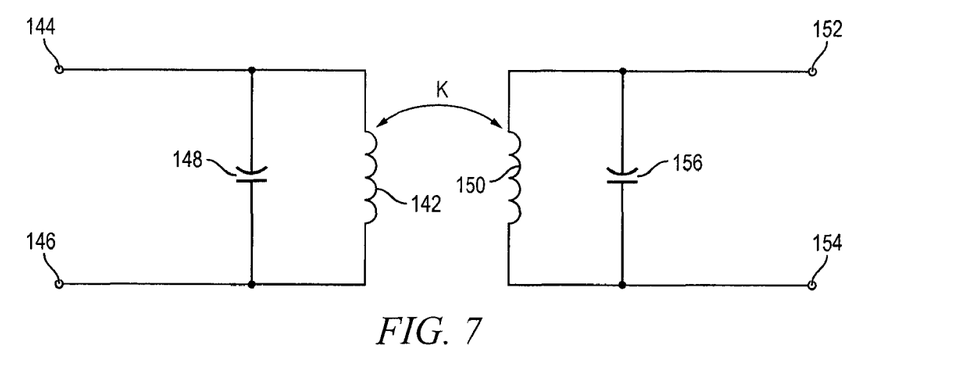
FIG. 7 illustrates a schematic circuit diagram of the RF balun.

FIG. 7 shows an electrical schematic diagram of RF balun 140 with inductors 142 and 150 and capacitors 148 and 156. The inductors 142 and 150 are wound to create relatively small magnetic coupling between the inductors, e.g., coupling coefficient k=0.2 to 0.45, for a narrow band response. The inductive coupling strength can be adjusted by changing the distance D1 between the two coils.

Figure 8:
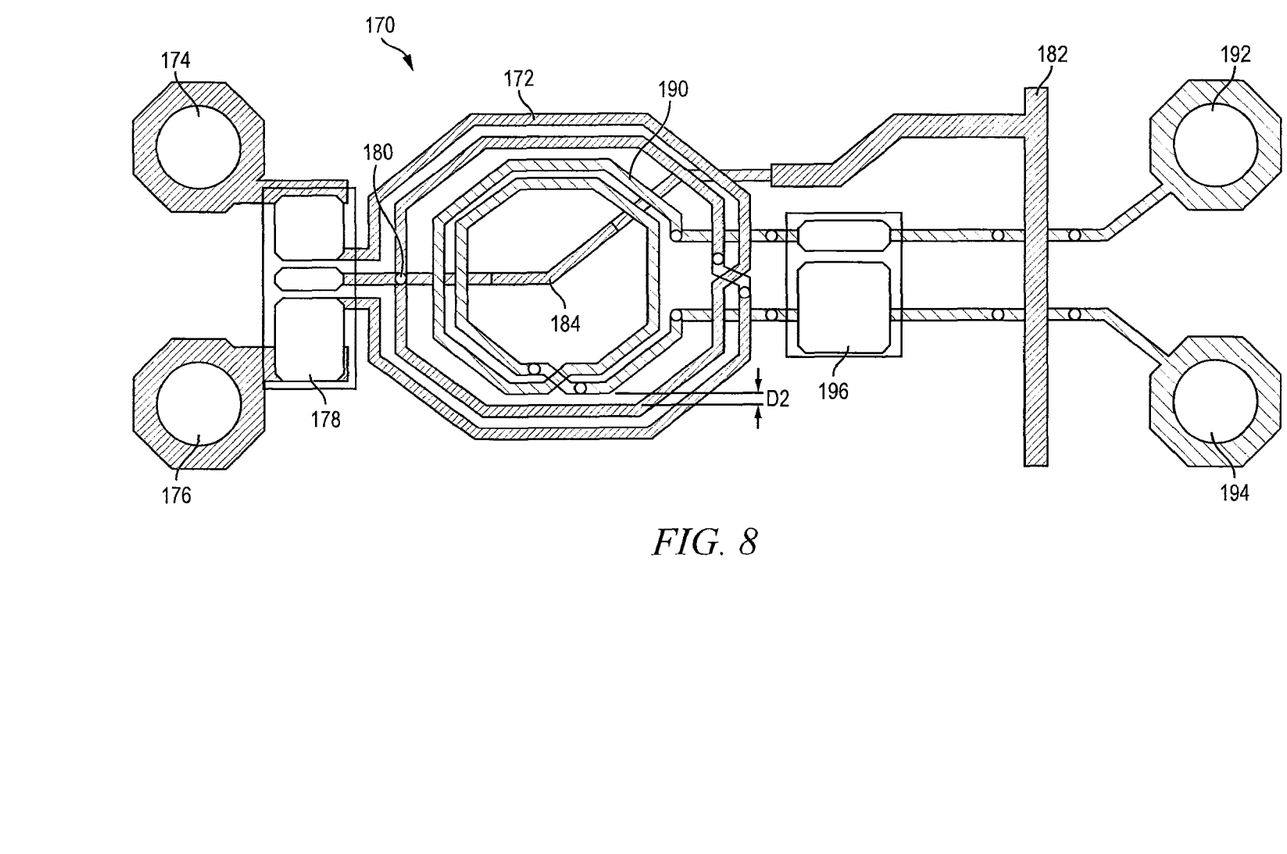
FIG. 8 illustrates another embodiment of the integrated RF balun.

In another embodiment, an integrated RF balun 170 is shown in FIG. 8 implemented using LC resonators. A conductive trace or coil 172 is wound to exhibit inductive properties and includes first and second end terminals coupled to balanced ports 174 and 176. Conductive trace 172 is formed in a polygonal, circular, or oval shape with a line width of 20 $\mu$m and pitch or spacing of 10 $\mu$m. A capacitor 178 is coupled between balanced ports 174 and 176. The center-tap 180 provides a DC bias through capacitor 178 to ports 174 and 176. The DC bias is supplied from power bus 182 through conductive trace 184 to center tap 180. Capacitor 178 can be divided into two parts connected to center-tap 180. By slightly unbalancing the two divided capacitors, the balance can be optimized. The inductor 142 and capacitor 148 constitute a first LC resonator.

Another conductive trace or coil 190 is wound to exhibit inductive properties and includes first and second end terminals coupled to port 192 and port 194. In one embodiment, port 192 is a single-ended unbalanced port and port 194 is a single-ended ground terminal. Alternatively, port 194 is a single-ended unbalanced port and port 192 is the ground terminal. Conductive trace 190 is formed within conductive trace 172 such that conductive trace 190 (inner conductive trace) is disposed predominantly or substantially inside conductive trace 172 (outer conductive trace) with separation D2=50 μm to reduce both inductive coupling and capacitive coupling between the conductive traces. In other words, all parts of the wound portion of conductive trace 190 are disposed completely within all parts of the wound portion of conductive trace 172, as shown in FIG. 8. Conductive trace 190 can be formed with a polygonal, circular, or oval shape and line width of 20 μm and pitch or spacing of 10 μm. A capacitor 196 is coupled between port 192 and port 194. The inductor 190 and capacitor 196 constitute a second LC resonator.

A figure of merit for the RF balun can be expressed as the input and output return loss, insertion loss, and balance (amplitude and phase) at the differential port. Common-mode rejection in the RF balun is closely related to the balance. In receiver circuits, such as low noise amplifiers, common-mode signals result in power supply modulation and self-mixing. In transmitters, even-order harmonics are typically present in the common-mode output. It is desirable to block the harmonics to maintain high linearity and electromagnetic compliance.

Since the common-mode bias connection is not ideally isolated, RF coupling to the bias supply can introduce a common-mode component at the balanced terminals. At higher output powers, approaching the compression point of the amplifier, even-harmonic components in the output spectrum are also introduced into the common-mode. Accordingly, a high CMRR is important to remove common-mode signals from the output of the RF balun.

The insertion loss or differential-mode gain is a measure of the power scattered from the unbalanced port to the differential port, as given by equation (1).

$$DMG = S_{DU} = (S_{21} - S_{31})/\sqrt{2} \quad (1)$$

The RF balun common-mode gain (inverse of the CMRR) is a measure of the power scattered from the unbalanced port into the common-mode port, as given by equation (2).

$$CMG = S_{CU} = (S_{21} + S_{31})/\sqrt{2} \quad (2)$$

The balance characteristics of the RF balun are expressed in terms of the S-parameters. For an RF input signal to the unbalanced port, the amplitude and phase differences are measured between the balanced ports and expressed in equations (3) and (4) terms of the common-mode and differential-mode gains from equations (1) and (2) as:

$$S_{21} = (CMG + DMG)/\sqrt{2} \quad (3)$$

$$S_{31} = (CMG - DMG)/\sqrt{2} \quad (4)$$

From equations (3) and (4), the common-mode gain approaches zero, i.e., high CMRR, as $S_{21}$ approaches $S_{31}$. The amplitude balance is optimized and the phase difference between the two outputs is 180°. Therefore, high CMRR is directly associated with optimized amplitude and phase balance characteristics.

Table 1 shows a comparison chart of various parameters illustrating the difference between the RF balun implementation (interleaved conductive traces) of prior art FIG. 1, and the RF balun implementation (inner and outer conductive traces) of the present invention embodiment in FIG. 6.

TABLE 1

Parameter comparison of FIG. 1 and FIG. 6

|  | FIG. 1 | FIG. 6 |
| --- | --- | --- |
| Coupling coefficient | 0.65 | 0.44 |
| Bandwidth (GHz) | 3.85 | 1.90 |
| Insertion loss (dB) | 0.75 | 0.94 |
| CMRR (dB) | 25.9 | 36.8 |
| Amplitude imbalance (dB) | 0.90 | 0.12 |
| Phase imbalance (degrees) | 2.4 | 1.8 |

Figure 9:
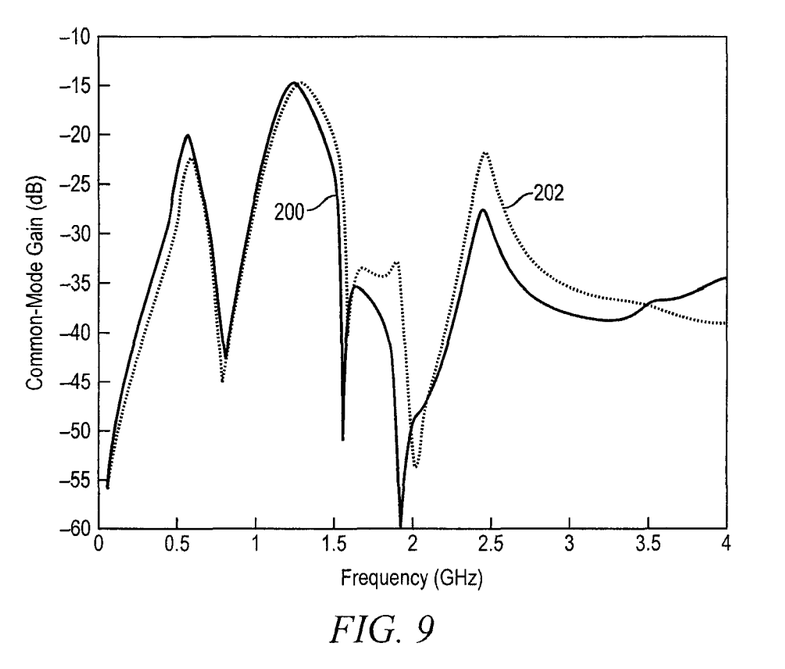
FIG. 9 is a waveform plot of common mode gain versus frequency for the integrated RF balun.

FIG. 9 shows a waveform plot of common mode gain expressed in dB versus frequency expressed in GHz. Line 200 represents measured common mode gain and line 202 represents simulated common mode gain for the RF balun implementation (inner and outer conductive traces) of the present invention embodiment in FIG. 6. Note that the CMRR in the pass-band, e.g., 1.81 GHz, is about −35.0 dB, which is about 10 dB higher than the RF balun implementation (interleaved conductive traces) of prior art FIG. 1. The increase in CMRR is attributed in part to the reduced capacitive coupling from the present implementation using inner and outer conductive traces.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    forming an inner conductive trace over the substrate and wound to exhibit an inductive property including a first end coupled to a first terminal of the semiconductor device and a second end coupled to a second terminal of the semiconductor device; and
    forming an outer conductive trace over the substrate completely around the inner conductive trace and wound to exhibit an inductive property including a distance separating the inner conductive trace and outer conductive trace to reduce capacitive coupling, a first end coupled to a third terminal of the semiconductor device, and a second end coupled to a fourth terminal of the semiconductor device.

2. The method of claim 1, wherein the inner conductive trace and outer conductive trace are separated by 50 micrometers to reduce capacitive and inductive coupling.

3. The method of claim 1, wherein the inner conductive trace and outer conductive trace have a coupling coefficient between 0.2 and 0.45.

4. The method of claim 1, further including:
    forming a first capacitor over the substrate and coupled between the first and second ends of the inner conductive trace; and
    forming a second capacitor over the substrate and coupled between the first and second ends of the outer conductive trace.

5. The method of claim 1, wherein the inner conductive trace and outer conductive traces each have an oval, circular, or polygonal shape.

6. The method of claim 1, further including:
providing a center tap midway between the first and second ends of the outer conductive trace; and
applying a DC bias to the center tap.

7. A method of making a semiconductor device, comprising:
providing a substrate;
forming a first conductive trace encircling a portion of the substrate and wound in a coil to exhibit an inductive property;
forming a second conductive trace over the substrate encircling the first conductive trace and wound in a coil to exhibit an inductive property;
providing a center tap midway between first and second ends of the second conductive trace; and
applying a DC bias to the center tap.

8. The method of claim 7, wherein the first conductive trace and second conductive trace are separated by 50 micrometers to reduce capacitive and inductive coupling.

9. The method of claim 7, wherein the first conductive trace and second conductive trace have a coupling coefficient between 0.2 and 0.45.

10. The method of claim 7, further including:
forming a first capacitor over the substrate and coupled between first and second ends of the first conductive trace; and
forming a second capacitor over the substrate and coupled between first and second ends of the second conductive trace.

11. The method of claim 7, wherein a first end of the first conductive trace is coupled to a first terminal of the semiconductor device, a second end of the first conductive trace is coupled to a second terminal of the semiconductor device, a first end of the second conductive trace is coupled to a third terminal of the semiconductor device, and a second end of the second conductive trace is coupled to a fourth terminal of the semiconductor device.

12. The method of claim 7, wherein the first conductive trace and second conductive traces each have an oval, circular, or polygonal shape.

13. A method of making a semiconductor device, comprising:
providing a substrate;
forming a first inductor over the substrate; and
forming a second inductor over the substrate with the first inductor disposed within the second inductor and separated from the second inductor by a distance to reduce coupling.

14. The method of claim 13, further including:
forming a first capacitor over the substrate and coupled between first and second ends of the first inductor; and
forming a second capacitor over the substrate and coupled between first and second ends of the second inductor.

15. The method of claim 13, wherein forming the first inductor and second inductor includes:
forming a first conductive trace over the substrate and wound to exhibit an inductive property; and
forming a second conductive trace over the substrate and wound to exhibit an inductive property with the first conductive trace disposed within the second conductive trace.

16. The method of claim 15, wherein the first conductive trace and second conductive traces each have an oval, circular, or polygonal shape.

17. The method of claim 13, wherein the first inductor and second inductor are separated by 50 micrometers to reduce capacitive and inductive coupling.

18. The method of claim 13, wherein the first inductor and second inductor have a coupling coefficient between 0.2 and 0.45.

19. A semiconductor device, comprising:
a substrate;
a first conductive trace formed over the substrate and wound to exhibit an inductive property; and
a second conductive trace formed over the substrate and wound to exhibit an inductive property with the first conductive trace completely encircled by the second conductive trace.

20. The semiconductor device of claim 19, wherein the first conductive trace and second conductive traces each have an oval, circular, or polygonal shape.

21. The semiconductor device of claim 19, wherein the first conductive trace and second conductive trace are separated by 50 micrometers to reduce capacitive and inductive coupling.

22. The semiconductor device of claim 19, wherein the first conductive trace and second conductive trace have a coupling coefficient between 0.2 and 0.45.

23. The semiconductor device of claim 19, further including:
forming a first capacitor over the substrate and coupled between first and second ends of the first conductive trace; and
forming a second capacitor over the substrate and coupled between first and second ends of the second conductive trace.

24. The semiconductor device of claim 19, wherein a first end of the first conductive trace is coupled to a first terminal of the semiconductor device, a second end of the first conductive trace is coupled to a second terminal of the semiconductor device, a first end of the second conductive trace is coupled to a third terminal of the semiconductor device, and a second end of the second conductive trace is coupled to a fourth terminal of the semiconductor device.

* * * * *